US012776457B2

(12) United States Patent
Caldwell et al.

(10) Patent No.: US 12,776,457 B2
(45) Date of Patent: Oct. 27, 2026

(54) HEATSINK CONNECTED WITH A COMMON OUTPUT AND MULTIPLE SOURCES

(71) Applicant: Vertiv Corporation, Columbus, OH (US)

(72) Inventors: Carl Caldwell, Cardington, OH (US); Devin Deboer, Westerville, OH (US); Gregg Nelson, Delaware, OH (US); Jason Peltier, Dublin, OH (US); Tom Lammers, Lewis Center, OH (US); John Van Fossen, Powell, OH (US); Chad Holt, Cardington, OH (US); Greg Funk, Delaware, OH (US); Mike Oller, Delaware, OH (US)

(73) Assignee: Vertiv Corporation

( * ) Notice: Subject to any disclaimer, the term of this patent is extended or adjusted under 35 U.S.C. 154(b) by 448 days.

(21) Appl. No.: 18/072,934

(22) Filed: Dec. 1, 2022

(65) Prior Publication Data

US 2023/0170162 A1 Jun. 1, 2023

Related U.S. Application Data

(60) Provisional application No. 63/284,854, filed on Dec. 1, 2021.

(51) Int. Cl.
*H01H 9/52* (2006.01)
*H01H 1/62* (2006.01)
(Continued)

(52) U.S. Cl.
CPC ................ *H01H 9/52* (2013.01); *H02G 5/10* (2013.01); *H05K 7/20154* (2013.01);
(Continued)

(58) Field of Classification Search
CPC ........... H05K 7/20136; H05K 7/20154; H05K 7/2039; H05K 7/20509; H05K 7/20518; H01H 1/62; H01H 9/52; H02G 5/10
See application file for complete search history.

(56) References Cited

U.S. PATENT DOCUMENTS 11,690,195 B2 * 6/2023 Kendzia, III ....... H01L 23/3672 361/679.48
2004/0256916 A1 12/2004 Reichle et al.
(Continued)

*Primary Examiner* — Jayprakash N Gandhi
*Assistant Examiner* — Steven Ngo
(74) *Attorney, Agent, or Firm* — Dickinson Wright PLLC

(57) ABSTRACT

A switching apparatus provides switching modules, each of which can switch a voltage from an independent power source. Additionally, the switching apparatus provides a single output for independent sources, with the single output providing a power source for a load (e.g., server). In order to dissipate thermal energy, the switching apparatus includes a heatsink that is directly coupled to the switching modules. As a result of the connection between the heatsink and the switching modules, the switching apparatus can reduce the size of the heatsink as well the number of heatsinks. In this manner, the size, footprint, and amount of material of the switching apparatus is reduced, thus reducing the cost of the switching apparatus as well as increasing the ability to provide additional switching apparatuses in a volume, such as a cabinet.

6 Claims, 7 Drawing Sheets

(51) Int. Cl.

| | |
|---|---|
| ***H02G 5/10*** | (2006.01) |
| ***H05K 7/20*** | (2006.01) |
| ***H10W 40/22*** | (2026.01) |
| ***H10W 40/43*** | (2026.01) |

(52) U.S. Cl.
CPC ......... *H10W 40/226* (2026.01); *H10W 40/43* (2026.01); *H01H 1/62* (2013.01); *H05K 7/2039* (2013.01); *H05K 7/20509* (2013.01)

(56) References Cited

U.S. PATENT DOCUMENTS

| | | | | |
|---|---|---|---|---|
| 2007/0076355 | A1 | 4/2007 | Oohama | |
| 2010/0066431 | A1 * | 3/2010 | Carter ..................... | H02J 9/061<br>327/408 |
| 2016/0165759 | A1 * | 6/2016 | Buschendorf ......... | H02M 7/003<br>361/709 |
| 2017/0141560 | A1 * | 5/2017 | Waldron ................ | H02H 3/033 |

* cited by examiner

HEATSINK CONNECTED WITH A COMMON OUTPUT AND MULTIPLE SOURCES

CROSS-REFERENCE TO RELATED APPLICATIONS

This patent application claims the benefit and priority to U.S. Provisional Patent Application Ser. No. 63/284,854, filed Dec. 1, 2021 the entire disclosure of which is incorporated herein by reference.

FIELD

The following description relates to heatsinks in a switching assembly. In particular, the following description relates to a heatsink connected, at inputs, to multiple power sources that can be switched by switching modules, while providing a common electrical output to a load and dissipating thermal energy from the switching modules.

BACKGROUND

Switching devices may include heatsinks used to dissipate thermal energy from a switching module. Typically, a switching device includes a separate heatsink for each switching module (and each electrical source). Using a separate heatsink for each switching module increases the part cost and reduces thermal efficiency. For example, for a switching device that switches a single switching module at a time, the required thermal energy dissipation is limited to the switching module that is conducting electrical current, and the use of individual heatsinks (for each switching module) requires additional heatsinks.

SUMMARY

An aspect of the disclosed embodiments includes a switching apparatus. The switching apparatus may include a first switching module configured to switch a first voltage source. The switching apparatus may further include a second switching module configured to switch a second voltage source. The switching apparatus may further include a heatsink thermally coupled to the first switching module and the second switching module. The heatsink can define an output for the first voltage source and the second voltage source.

Another aspect of the disclosed embodiments includes a switching apparatus. The switching apparatus may include a first switching module configured to switch a first voltage source. The switching apparatus may further include a first pair of heatsinks thermally coupled to the first switching module. The switching apparatus may further include a second switching module configured to switch a second voltage source. The switching apparatus may further include a second pair of heatsinks thermally coupled to the second switching module. The switching apparatus may further include a controller that closes one of the first switching module and the second switching module. The switching apparatus may further include a heatsink connected to the first switching module and the second switching module. The heatsink can provide an electrical output, based on the controller, for one of the first voltage source and the second voltage source.

An aspect of the disclosed embodiments includes a method for switching voltage. The method may be performed by a switching apparatus. The method may include receiving, by a first switching module, a first voltage potential from a first power source. The first switching module can be coupled to a heatsink. The method may further include monitoring, by a controller, the first power source. The method may further includes, responsive to the controller determining the first power source does not provide the first voltage potential, opening the first switching module. The method may further include receiving, by a second switching module, a second voltage potential from a second power source. The second switching module can be coupled to the heatsink.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure is best understood from the following detailed description when read in conjunction with the accompanying drawings. It is emphasized that, according to common practice, the various features of the drawings are not necessarily to-scale. On the contrary, the dimensions of the various features may be arbitrarily expanded or reduced for clarity.

Figure 1:
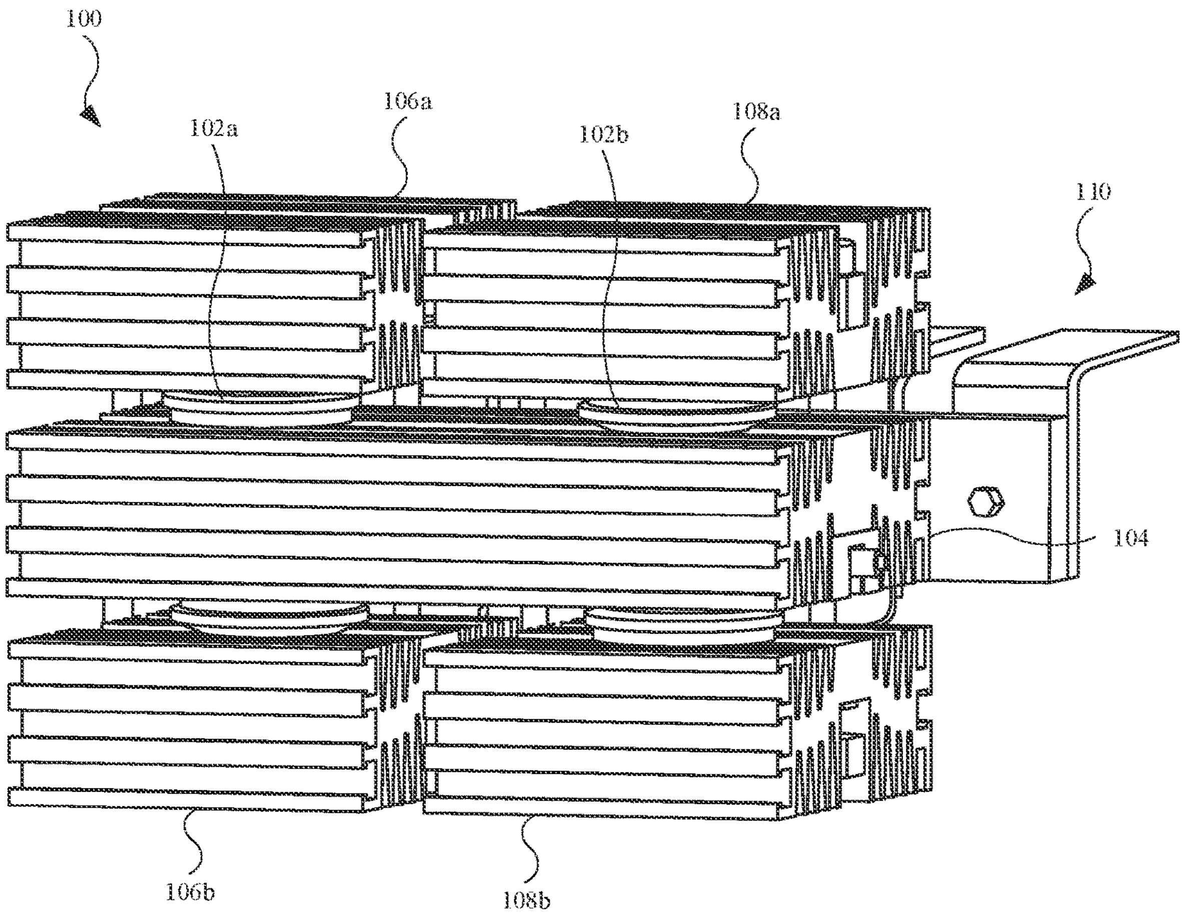
FIG. 1 illustrates a front isometric view of an embodiment of a switching apparatus, according to the principles of the present disclosure.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a switching apparatus that is optimized to enhance thermal efficiency and material efficiency. A switching apparatus described herein may refer to a static transfer switch ("STS"). In this regard, a switching apparatus is designed to switch (i.e., close a circuit and allow electrical current to conduct) two or more independent voltage sources (i.e., power sources), and provide a single electrical output to a load. In some embodiments, one of the voltage sources includes a primary source and the other voltage source(s) is a standby (or backup) source. Further, in some embodiments, the load includes a server. In this example, the switching apparatus can be used to promote an interrupted power supply to the server.

The embodiments shown and described herein include several advantageous modifications. For example, the switching apparatus may include multiple switching modules coupled to a heatsink. The heatsink represents a single heatsink that is common to each of the switching modules of the switching apparatus. As a result, the heatsink represents a single part to replace multiple, discrete heatsinks (one for each switching module), thus reducing the complexity and increasing the thermal mass of the heatsink for more efficient cooling. When conducting electrical current, the switching modules generate thermal energy, and the heatsink can draw the thermal energy away from the switching modules. Moreover, the switching apparatus can be designed to use only one voltage source at a time, and thus close one switching module at a time. Accordingly, having one heatsink that is common to the switching modules reduces not only the number of heatsinks but also the size and footprint of the heatsink, as the heatsink is required to draw thermal energy from only one switching module at a time.

Additionally, the heatsink can provide a common output to the voltage sources. In this manner, the heatsink can be electrically connected to each of the switching modules, as well as a single output that is electrically connected to the load. As a result, the single output heatsink may save on component costs, and/or tooling costs, and may reduce design complexity. Additionally, the common output heatsink allows for additional thermal mass to absorb and reject more heat than separate individual heatsink solutions.

These and other embodiments are discussed below with reference to FIGS. 1-6. However, those skilled in the art will readily appreciate that the detailed description given herein with respect to these Figures is for explanatory purposes only and should not be construed as limiting.

FIG. 1 illustrates a front isometric view of an embodiment of a switching apparatus 100. The switching apparatus 100 is designed to provide a common output (i.e., common electrical output) for multiple power sources (not shown in FIG. 1). As shown, the switching apparatus 100 includes a switching module 102*a* and a switching module 102*b*. The switching modules 102*a* and 102*b* are designed to switch (i.e., act as an on/off switch to close an electrical circuit to conduct electrical current or open the circuit to prevent electrical current conduction) for power sources. In some embodiments, the switching modules 102*a* and 102*b* are solid-state switches. For example, the switching modules 102*a* and 102*b* may each include a silicon-controlled rectifier ("SCR"). Further, when the switching modules 102*a* and 102*b* are SCR's, the SCR's may include a cylindrical (or at least substantially cylindrical) shape. The switching of the switching modules 102*a* and 102*b* may be non-concurrent. For example, when the switching module 102*a* is conducting electrical current, the switching module 102*b* is open, i.e. not conducting electrical current, and vice versa.

Also, the switching apparatus 100 further includes a heatsink 104 that is coupled to the switching modules 102*a* and 102*b*. The coupling may refer to a direct, mechanical connection between the heatsink 104 and the switching modules 102*a* and 102*b*. Based on the coupling, the heatsink 104 is designed to dissipate/draw thermal energy from the switching modules 102*a* and 102*b*. For example, when the switching module 102*a* is conducting electrical current, a voltage drop across the switching module 102*a* occurs and losses in the form electrical energy converting to thermal energy results. A similar result occurs when the switching module 102*b* is conducting electrical current. However, based on the coupling between the heatsink 104 and the switching modules 102*a* and 102*b*, the heatsink 104 can dissipate the resultant thermal energy.

To further dissipate thermal energy, the switching apparatus 100 may include additional heatsinks. For example, the switching apparatus 100 may include a heatsink 106*a* and a heatsink 106*b* used to draw additional thermal energy from the switching module 102*a*. Additionally, the switching apparatus 100 may include a heatsink 108*a* and a heatsink 108*b* used to draw additional thermal energy from the switching module 102*b*. The heatsinks 106*a* and 106*b* can be electrically isolated from the heatsinks 108*a* and 108*b*. However, the heatsinks 106*a* and 106*b* can be electrically coupled to the switching module 102*a* and the heatsink 104. Similarly, the heatsinks 108*a* and 108*b* can be electrically coupled to the switching module 102*b* and the heatsink 104.

Additionally, the heatsink 104 can provide an electrical output for the power sources. For example, the switching apparatus 100 may further include a bus bar assembly 110 that provides several electrical connections. As shown, the bus bar assembly 110 is connected to the heatsink 104. Additional features of the bus bar assembly 110 will be shown and described below.

Figure 2:
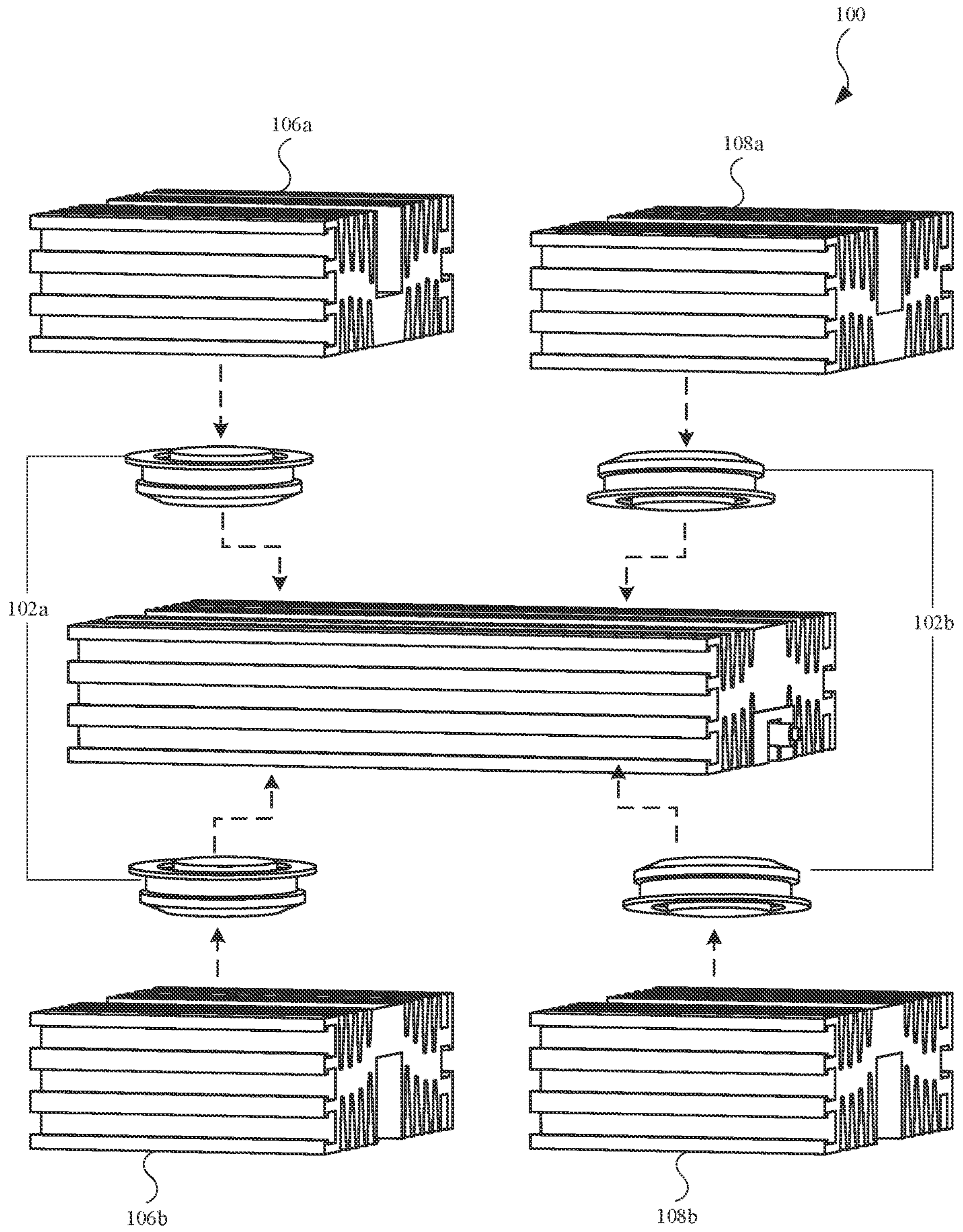
FIG. 2 illustrates an exploded view of the switching apparatus shown in FIG. 1, showing additional features, according to the principles of the present disclosure.

FIG. 2 illustrates an exploded view of the switching apparatus 100 shown in FIG. 1, showing additional features. For purposes of illustration, the bus bar assembly 110 is removed. In some embodiments, the switching modules 102*a* and 102*b* can be part of an assembly of switching modules. In this manner, each of the switching modules 102*a* and 102*b* can use one module (of an assembly) to switch a positive portion of an alternating current ("AC") power source and the other module to switch a negative portion of the AC power source. Using this configuration, a controller (not shown in FIG. 2) can monitor the power sources connected to the switching apparatus 100 and determine which of the switching modules 102*a* and 102*b* should be used/closed to conduct current. For example, if the power source connected to the switching module 102*a* is a primary power source, the controller can control the switching module 102*a* to close and the switching apparatus 102*b* to open. This allows the primary power source to provide electrical current, and thus a voltage potential, to a load via the switching module 102*a*. However, when the controller determines the primary source is no longer supplying electrical current (or at least below a threshold electrical current), the controller can control the switching module 102*a* to open and the switching module 102*b* to close, thereby allowing, for example, a standby power source to supply electrical current to the load via the switching module 102*b*. Other configurations are possible. For example, in some embodiments, the switching modules 102*a* and 102*b* are cross-coupled to handle the positive and negative cycles of the AC source.

Figure 3:
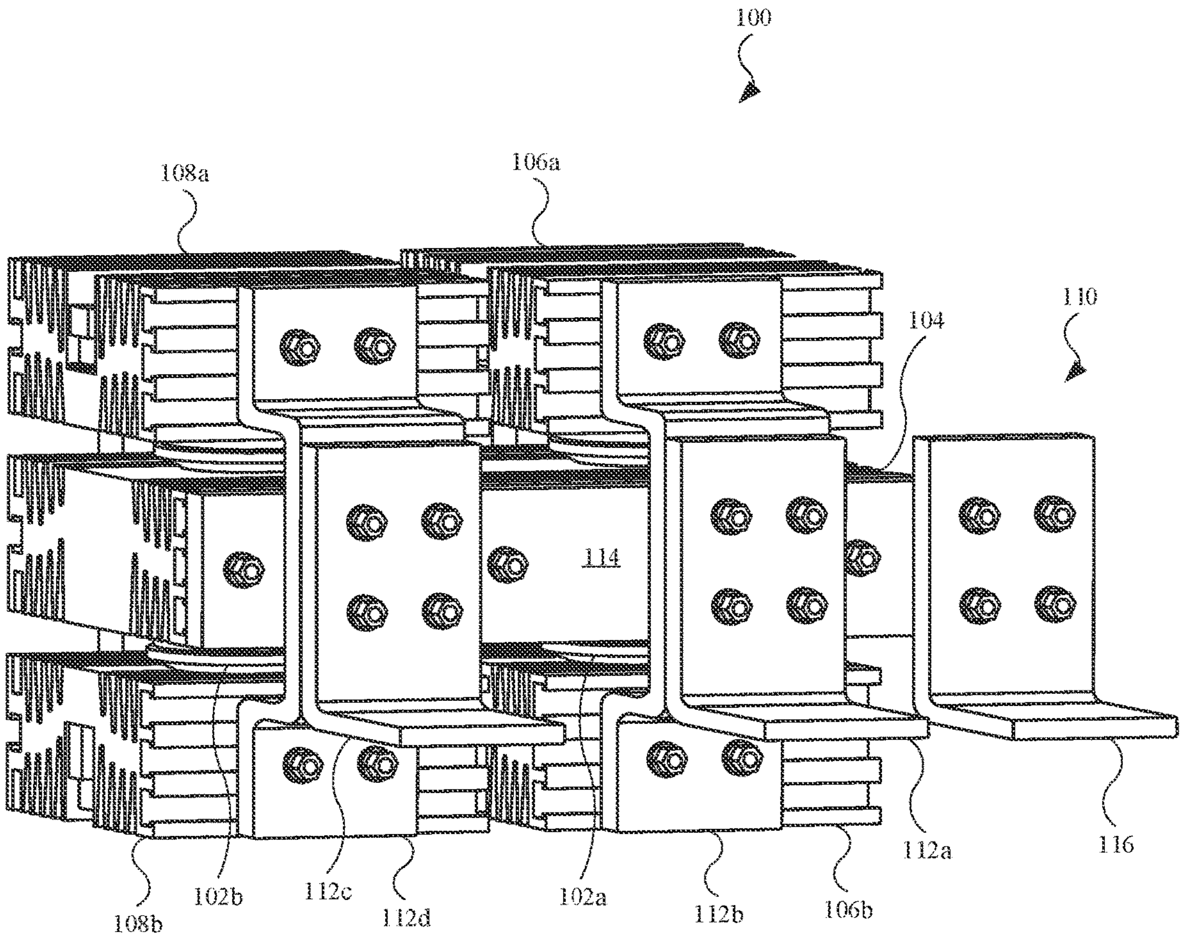
FIG. 3 illustrates a rear isometric view of the switching apparatus shown in FIG. 1, showing additional features, according to the principles of the present disclosure.

FIG. 3 illustrates a rear isometric view of the switching apparatus 100 shown in FIG. 1, showing additional features. As shown, the bus bar assembly 110 includes several connections to the heatsinks. For example, the bus bar assembly 110 includes a bar 112*a* that can be used as a terminal (or input) for a power source (not shown in FIG. 3). Further, the bus bar assembly 110 includes a bar 112*b* that connected to the heatsinks 106*a* and 106*b*. Also, the bus bar assembly 110 includes a bar 114 that is connected to the heatsink 104. The bars 112*a* and 112*b* can be physically separated/isolated from the bar 114.

Additionally, the bus bar assembly 110 includes a bar 112*c* that can be used as a terminal (or input) for an additional power source (not shown in FIG. 3). Further, the bus bar assembly 110 includes a bar 112*d* that connected to the heatsinks 108*a* and 108*b*. The bars 112*c* and 112*d* can be physically separated/isolated from the bar 114.

Also, the bus bar assembly 110 includes a bar 116 that can be used as a terminal (output) for a load (not shown in FIG. 3), which may generally include any device that relies on electrical current to operate, such as a server or multiple servers. Based on the configuration, the switching apparatus 100 can rely on two independent power sources to power a load at different times. For example, during use of the power source connected to the bar 112*a*, electrical current flows through the bars 112*a* and 112*b*, the heatsinks 106*a* and 106*b*, the switching module 102*a*, the heatsink 104, the bars 114 and 116, and subsequently to the load. Accordingly, the aforementioned structural elements define an electrical path. Moreover, when the switching module 102*a* is conducting electrical current, the switching module 102*b* is open, i.e., is not conducting electrical current from an alternate power source connected to the bar 112*c*.

Alternatively, during use of the alternate power source connected to the bar 112*c*, electrical current flows through the bars 112*c* and 112*d*, the heatsinks 108*a* and 108*b*, the switching module 102*b*, the heatsink 104, the bars 114 and 116, and subsequently to the load. Accordingly, the aforementioned structural elements define an alternate electrical path. Moreover, when the switching module 102*b* is conducting electrical current, the switching module 102*a* is open, i.e., is not conducting electrical current from the primary power source connected to the bar 112*a*. Regardless of which power source is used, it can be seen that the heatsink provides a common electrical output for both electrical paths, while also providing thermal energy dissipation for each of the switching modules 102*a* and 102*b*.

Figure 4:
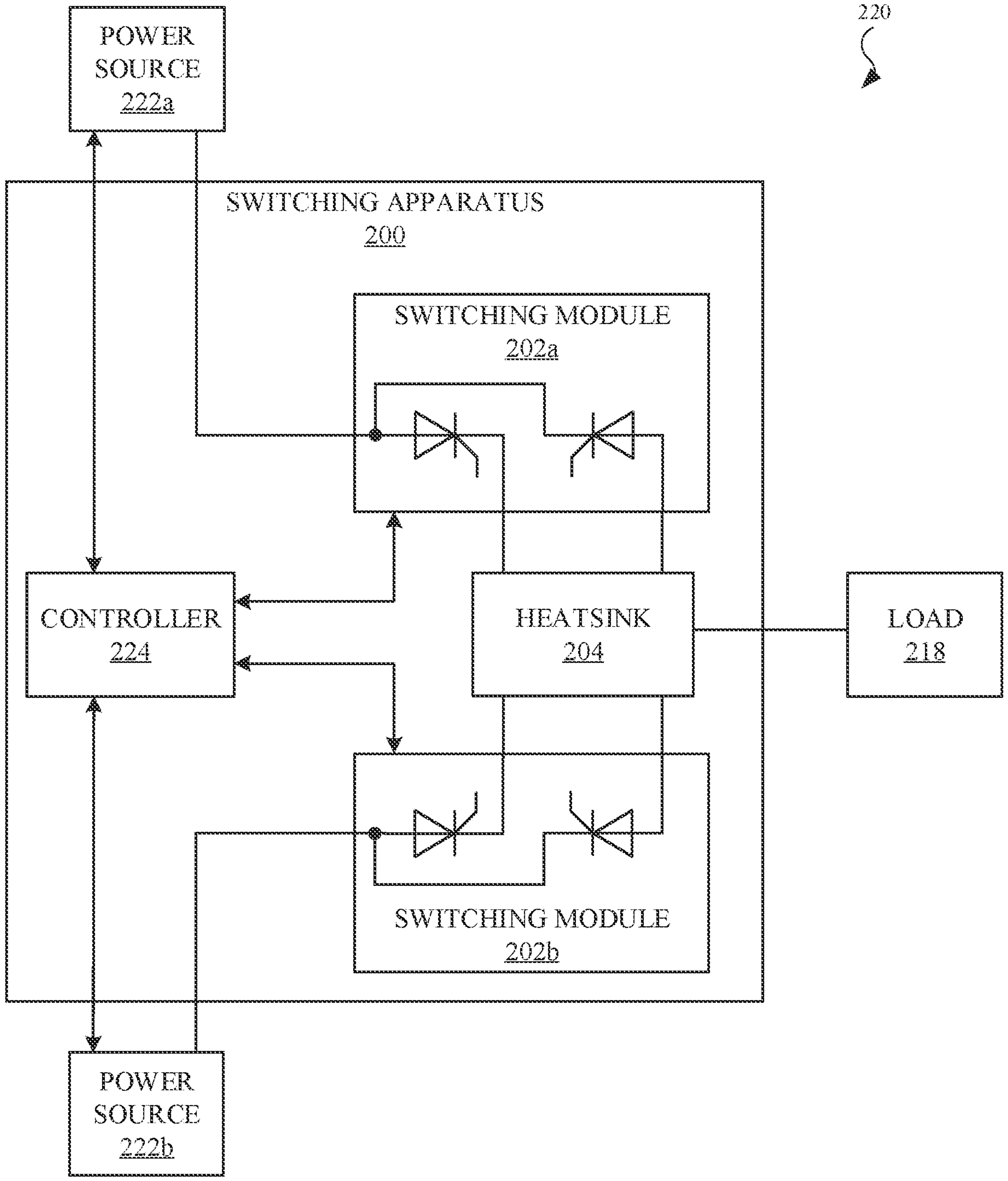
FIG. 4 illustrates a schematic diagram of a system, according to the principles of the present disclosure.
Figure 5:
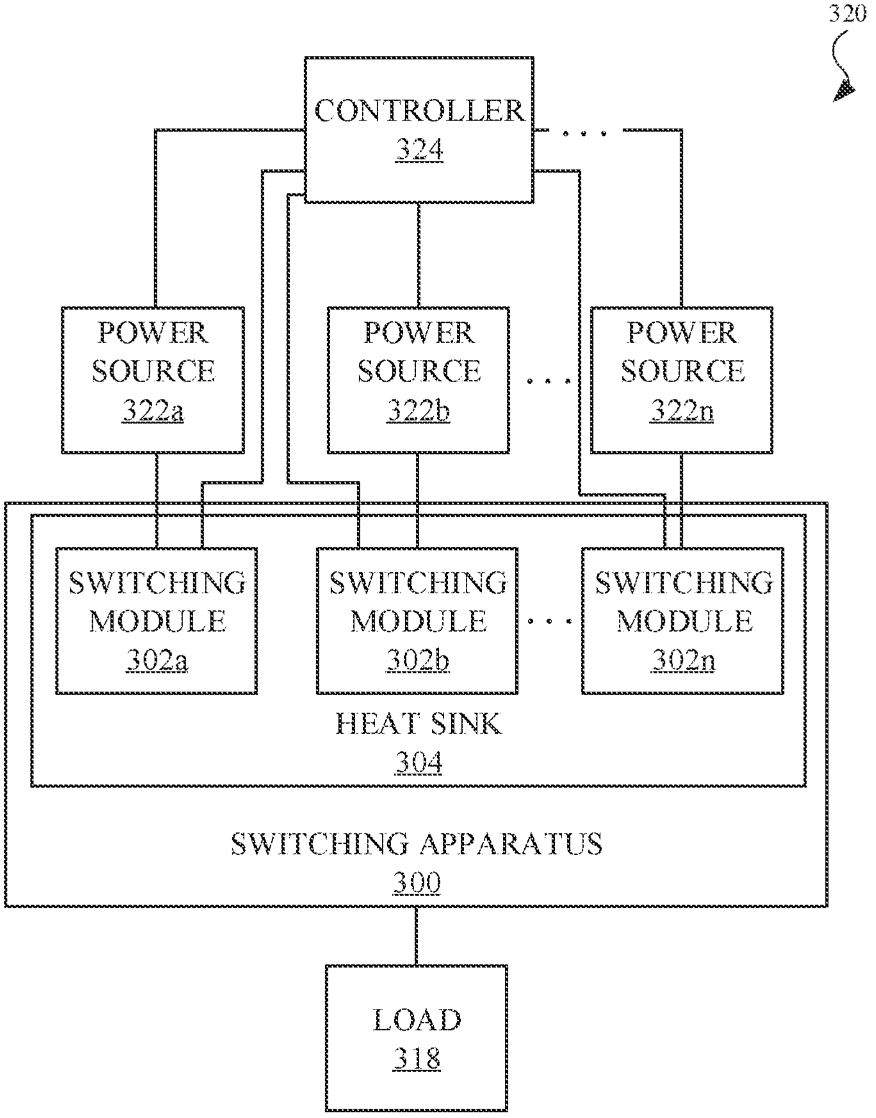
FIG. 5 illustrates a schematic diagram of an alternate embodiment of a system, according to the principles of the present disclosure.

FIGS. 4 and 5 show and describe alternate embodiments of a switching apparatus integrated into a system that includes power sources and loads. These features shown and described for switching apparatuses in FIGS. 4 and 5 may also be included in the switching apparatus 100 (shown in FIG. 1-3). Conversely, the switching apparatuses in FIGS. 4 and 5 may include any features shown and described for the switching apparatus 100 (shown in FIG. 1-3).

FIG. 4 illustrates a schematic diagram of a system 220, in accordance with some described embodiments. As shown, the system 220 includes a switching apparatus 200. The switching apparatus 200 includes a switching module 202*a* and a switching module 202*b*. Further, the switching modules 202*a* and 202*b* are connected to a heatsink 204. Each switching module 202*a* and 202*b* is electrically connected between a power source 222*a* or 222*b* and the heatsink. For example, as shown in FIG. 4, switching module 202*a* includes two unidirectional switches, oriented in opposite directions, connected between the power source 222*a* and the heat sink 204; switching module 202*b* includes two different unidirectional switches, oriented in opposite directions, connected between the power source 222*b* and the heat sink 204. In addition to dissipating thermal energy from the switching modules 202*a* and 202*b*, the heatsink 204 can be used as a common electrical output for the switching modules 202*a* and 202*b*. As shown, the heatsink 204 is used as an outlet to a load 218, which may include a server(s) (as a non-limiting example).

The switching apparatus 200 is connected to a power source 222*a* and a power source 222*b*. In some embodiments, the power source 222*a* is a primary power source, and the power source 222*b* is a secondary power source. As shown, the power source 222*a* and the power source 222*b* are connected to the switching module 202*a* and the switching module 202*b*, respectively. The switching apparatus 200 further includes a controller 224 used to monitor the power sources 222*a* and 222*b*, as well as operate the switching modules 202*a* and 202*b*. For example, when the controller 224 determines the power source 222*a* is providing sufficient voltage (or electrical current), the controller 224 can provide a command to close the switching module 202*a* and open the switching module 202*b*. In this manner, the power source 222*a* may supply power to the load 218. Alternatively, when the controller 224 determines the power source 222*a* is providing insufficient voltage (or electrical current), i.e. below a threshold voltage (or current), the controller 224 can provide a command to open the switching module 202*a* and close the switching module 202*b*. Subsequently, the power source 222*b* may thereby supply power to the load 218. In either event, the heatsink 204 provides a common electrical output for the power sources 222*a* and 222*b*. While the controller 224 is shown as being part of the switching apparatus 200, the controller 224 may be separate from the switching apparatus 200 in other embodiments.

FIG. 5 illustrates a schematic diagram of an alternate embodiment of a system 320. As shown, the system 320 includes multiple power sources and multiple switching modules. For example, the system 320 includes n power sources (power source 322*a*, power source 322*b*, and power source 322*n*). Further, the system 320 includes a switching apparatus 300 with n switching modules (switching module 302*a*, switching module 302*b*, and switching module 302*n*). In this regard, the switching apparatus 300 includes a switching module for each power source. The power source 322*a* may include a primary power source, while the power sources 322*b* through 302*n* are secondary power sources.

The system 320 further includes a controller 324 used monitor the power sources 322*a* through 322*n* and command one of the switching modules 302*a* through 302*n* to close (while commanding the remaining switching modules to open), and accordingly allow one of the power sources 322*a* through 322*n* to conduct electrical current. Similar to prior embodiments, the controller 324 can determine whether sufficient voltage (or current) is provided by a particular power source, and when the voltage (or current) is insufficient, the controller 324 can switch a different switching module, thereby causing a different power source to supply power to a load 318. Similar to prior embodiments, the switching apparatus 300 includes a heatsink 304 that is thermally and electrically connected to the switching modules 302*a* through 302*n*. Additionally, the heatsink 304 provides a common electrical output to the load 318.

While the foregoing embodiments shown described a switching apparatus designed with two or more inputs and a single (common) output, at least some of the switching apparatuses can be "reversed" while using the same components (i.e., the switching modules and a common heatsink). For example, a switching apparatus may include a single input and multiple outputs (each with a load), with the switching modules used to determine which of the loads is supplied with power.

Figure 6:
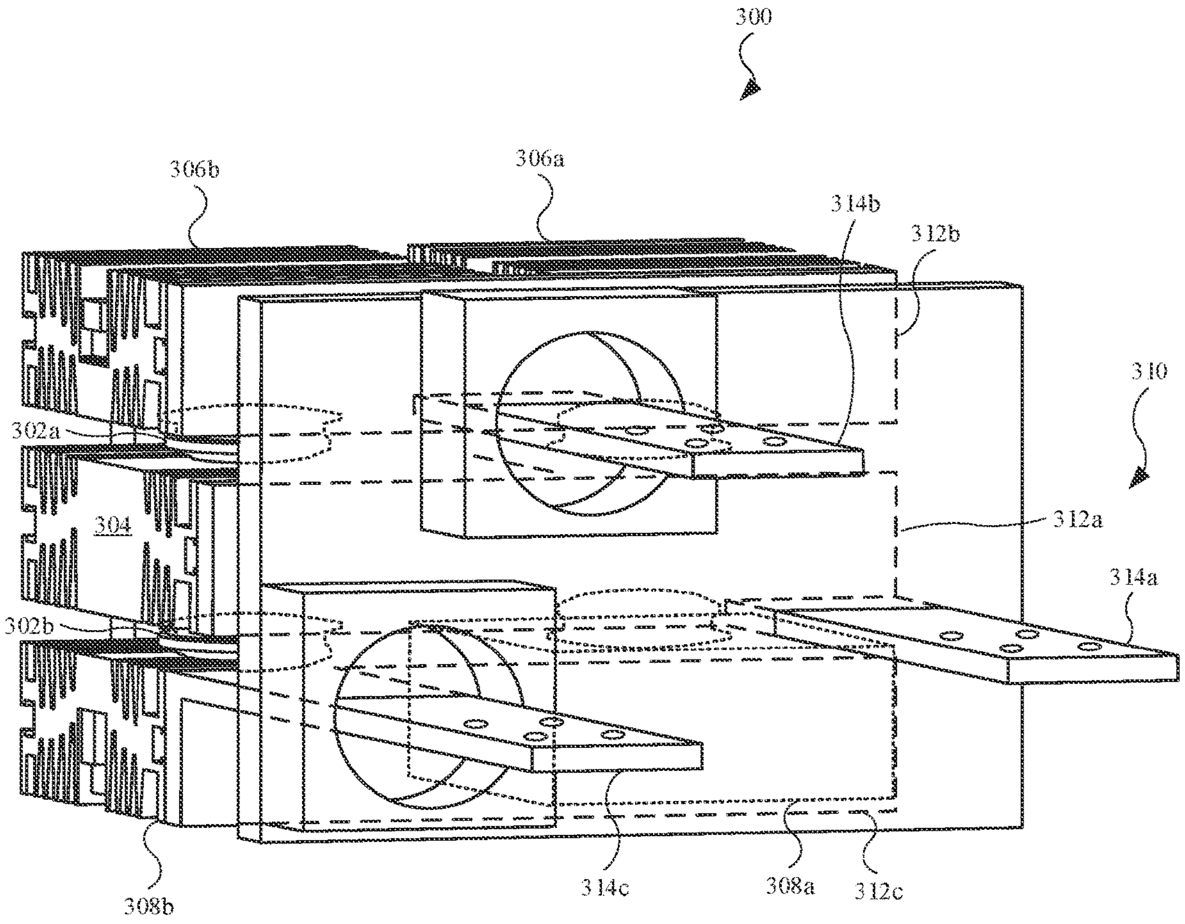
FIG. 6 illustrates a rear isometric view of an alternate embodiment of a switching apparatus, showing an additional arrangement, according to the principles of the present disclosure.

FIG. 6 illustrates a rear isometric view of an alternate embodiment of a switching apparatus 300, showing an additional arrangement. The switching apparatus 300 may include several features similar to those of the switching apparatus 100 (shown in FIGS. 1-3). For example, the switching apparatus 300 includes a switching module 302*a* and a switching module 302*b* designed to switch electrical circuit for power sources. The switching modules 302*a* and 302*b* may include any features previously described for switching modules. The switching apparatus 300 further includes a heatsink 304 that is coupled to the switching modules 302*a* and 302*b*. The coupling may refer to a direct, mechanical connection between the heatsink 304 and the switching modules 302*a* and 302*b*, thereby allowing the heatsink 304 to dissipate/draw thermal energy from the switching modules 302*a* and 302*b*. Additionally, the heatsink 304 can provide an electrical output for the aforementioned power sources.

Additionally, the switching apparatus 300 includes a heatsink 306*a* and a heatsink 306*b* used to draw additional thermal energy from the switching module 302*a*. Also, the switching apparatus 300 includes a heatsink 308*a* and a heatsink 308*b* (both represented as dotted lines) used to draw additional thermal energy from the switching module 302*b*. The heatsinks 306*a* and 306*b* can be electrically coupled to the switching module 302*a* and the heatsink 304. Similarly, the heatsinks 308*a* and 308*b* can be electrically coupled to the switching module 302*b* and the heatsink 304.

The switching apparatus 300 further includes a bus bar assembly 310 that provides several electrical connections. As shown, the bus bar assembly 310 includes a bar 312*a* that is connected to the heatsink 304, and an extension 314*a* (separable or integrally formed with the bar 312*a*) that can be used as an output terminal for a load (not shown in FIG. 6). The bus bar assembly 310 includes several connections to additional heatsinks. For example, the bus bar assembly 310 includes a bar 312*b* connected to the heatsinks 306*a* and 306*b*, and an extension 314*b* (separable or integrally formed with the bar 312*b*) that can be used as a terminal (or input) for a power source (not shown in FIG. 6). Further, the bus bar assembly 310 includes a bar 312*c* connected to the heatsinks 308*a* and 308*b*, and an extension 314*c* (separable or integrally formed with the bar 312*c*) that can be used as a terminal (or input) for an alternate power source (not shown in FIG. 6). In this manner, the switching module 302*a* and 302*b* can switch electrical current from a power source connected to the extension 314*b* and the extension 314*c*, respectively, and the extension 314*a* can be used as an output for either of the power sources.

In contrast to the bus bar assembly 110 (shown in FIG. 3)—with vertically stacked/aligned heatsinks 106*a* and 106*b* electrically connected by the bar 112*b* and the vertically stacked/aligned heatsinks 108*a* and 108*b* electrically connected by the bar 112*c*—the bus bar assembly 310 in FIG. 6 includes horizontally aligned heatsinks 306*a* and 306*b* electrically connected by the bar 312*b* and horizontally aligned heatsinks 308*a* and 308*b* electrically connected by the bar 312*c*. However, the heatsink 304 (centrally located) can provide a common output for a power source electrically connected to the switching module 302*a* (coupled with the heatsink 304 and the heatsinks 306*a* and 306*b*) and for a power source electrically connected to the switching module 302*b* (coupled with the heatsink 304 and the heatsinks 308*a* and 308*b*).

Figure 7:
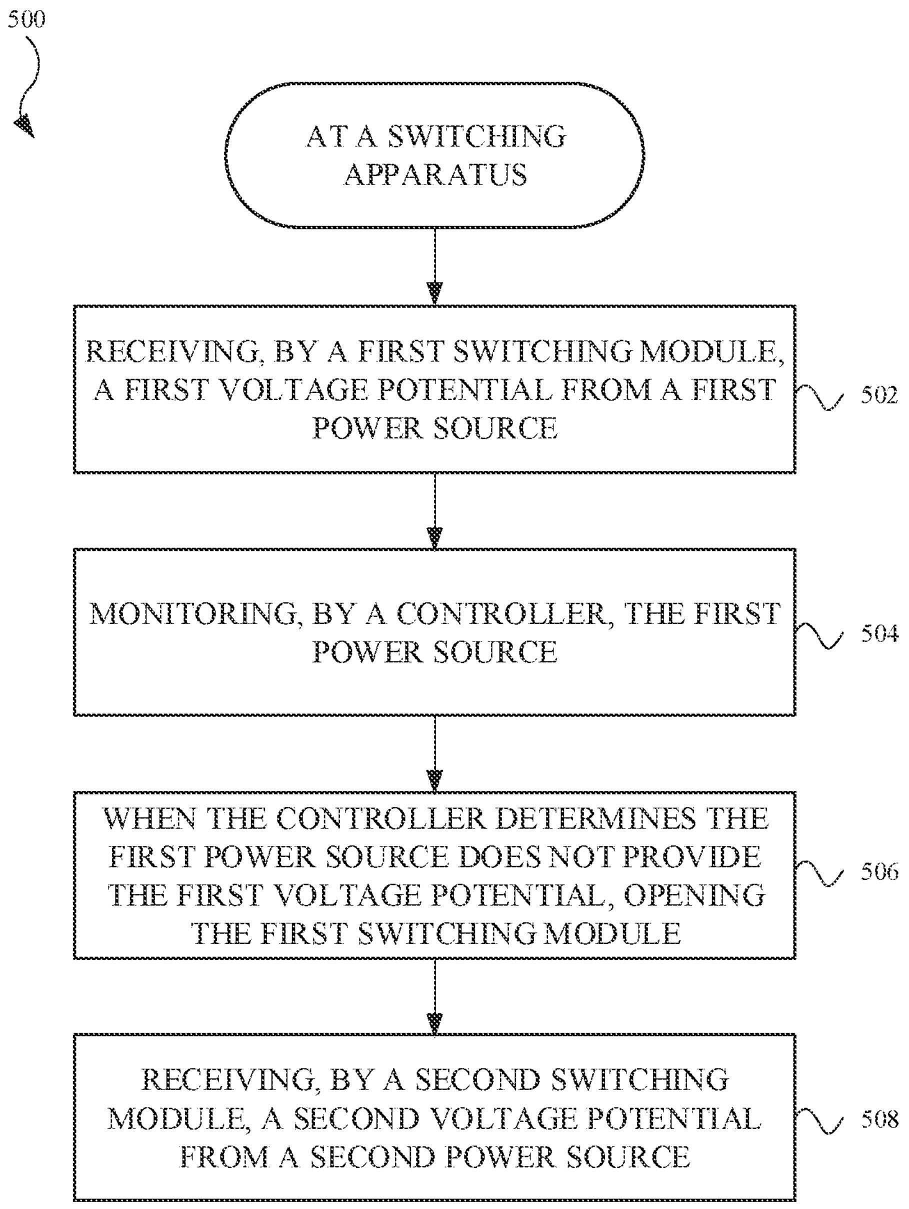
FIG. 7 illustrates a flowchart showing a method for switching voltage, according to the principles of the present disclosure.

FIG. 7 illustrates a flowchart 500 showing a method for switching voltage, in accordance with some described embodiments. The flowchart 500 can be implemented by one or more switching apparatuses shown and described herein.

In step 502, a first switching module receives a first voltage potential from a first power source. In some embodiments, the first switching module includes a solid-state switch, such as a silicon-controlled rectifier (as a non-limiting example). In this regard, when the first switching module is closed, electrical current supplied by the first power source is permitted to pass through the first switching module and to a load. Also, the switching apparatus may include a heatsink that is coupled (mechanically, thermally, and electrically) to the first switching module.

In step 504, a controller monitors the first power source. The controller can monitor the first power source and determine whether the first power source provides a voltage (or current) at or above a threshold voltage (or threshold current).

In step 506, when the controller determines the first power source does not provide the first voltage potential, the first switching module is opened. As an example, the first switching module can be opened when the first power source provides a voltage (or current) below the threshold voltage (or threshold current). The opening of the first switching module may be performed based on a command initiated by the controller.

In step 508, a second switching module receives a second voltage potential from a second power source. The second switching module may include any type of switch described for the first switching module. When the second switching module is closed, the electrical current supplied by the second power source is permitted to pass through the second switching module and to the load. Also, the heatsink is coupled (mechanically, thermally, and electrically) to the second switching module. Subsequent to the opening of the first switching module, the closing of the second switching module may be performed based on a subsequent command initiated by the controller. Based on the configuration, the heatsink provides a common electrical output to the first and second switching modules, and further to the first and second power sources.

Clause 1. A switching apparatus, comprising: a first switching module configured to switch a first voltage source; a second switching module configured to switch a second voltage source; and a heatsink thermally coupled to the first switching module and the second switching module, the heatsink defining an output for the first voltage source and the second voltage source.

Clause 2. The switching apparatus of clause 1 or any other clause described herein, wherein the output comprises a common electrical output.

Clause 3. The switching apparatus of clause 1 or any other clause described herein, further comprising: a second heatsink mounted to the first switching module; and a third heatsink mounted to the second switching module.

Clause 4. The switching apparatus of clause 3 or any other clause described herein, further comprising a bus bar assembly, the bus bar assembly comprising: a bar mounted to the heatsink; and an output terminal connected to the bar.

Clause 5. The switching apparatus of clause 4 or any other clause described herein, further comprising: a first terminal connected to the heatsink, the first terminal defining a first input to the first switching module; and a second terminal connected to the second heatsink, the second terminal defining a second input to the second switching module, wherein the first terminal and the second terminal are separated from the bar.

Clause 6. The switching apparatus of clause 1 or any other clause described herein, wherein the heatsink is directly connected to the first switching module and the second switching module.

Clause 7. The switching apparatus of clause 1 or any other clause described herein, wherein the heatsink is electrically coupled to the first switching module and the second switching module.

Clause 8. A switching apparatus, comprising: a first switching module configured to switch a first voltage source; a first pair of first heatsinks thermally coupled to the first switching module; a second switching module configured to switch a second voltage source; a second pair of heatsinks thermally coupled to the second switching module; a controller that closes one of the first switching module and the second switching module; and a second heatsink connected to the first switching module and the second switching module, the second heatsink providing an electrical output, based on the controller, for one of the first voltage source and the second voltage source.

Clause 9. The switching apparatus of clause 8 or any other clause described herein, wherein the second heatsink is electrically and thermally coupled to the first switching module and the second switching module.

Clause 10. The switching apparatus of clause 9 or any other clause described herein, wherein the second heatsink is directly connected to the first switching module and the second switching module.

Clause 11. The switching apparatus of clause 8 or any other clause described herein, wherein the controller is configured to open the first switching module when the first voltage source does not supply a voltage.

Clause 12. The switching apparatus of clause 11 or any other clause described herein, wherein the controller is configured to close the second switching module when the first voltage source does not supply the voltage.

Clause 13. The switching apparatus of clause 8 or any other clause described herein, wherein the second heatsink is positioned between the first pair of first heatsinks.

Clause 14. The switching apparatus of clause 8 or any other clause described herein, further comprising a bus bar assembly, the bus bar assembly comprising: a bar mounted to the heatsink; and an output terminal connected to the bar.

Clause 15. A method for switching voltage, the method comprising, at a switching apparatus: receiving, by a first switching module, a first voltage potential from a first power source, the first switching module coupled to a heatsink; monitoring, by a controller, the first power source; and, responsive to the controller determining the first power source does not provide the first voltage potential, opening the first switching module; and receiving, by a second switching module, a second voltage potential from a second power source, the second switching module coupled to the heatsink.

Clause 16. The method of clause 15 or any other clause described herein, wherein the heatsink is electrically and thermally coupled to the first switching module and the second switching module.

Clause 17. The method of clause 16 or any other clause described herein, wherein the heatsink is directly connected to the first switching module and the second switching module.

Clause 18. The method of clause 15 or any other clause described herein, providing, by the heatsink, an electrical output for one of the first power source and the second power source.

Clause 19. The method of clause 15 or any other clause described herein, wherein receiving the second voltage potential comprises closing, by the controller, the second switching module.

Clause 20. The method of clause 15 or any other clause described herein, wherein opening the first power source comprises opening, by the controller, the first switching module.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A switching apparatus, comprising:

a first switching module, comprising two first unidirectional switches, configured to switch a first alternating current (AC) voltage source, the first AC voltage source having a positive portion and a negative portion;

a second switching module, comprising two second unidirectional switches, configured to switch a second AC voltage source different from the first AC voltage source, the second AC power source having a positive portion and a negative portion;

a heatsink thermally and electrically coupled to the two first unidirectional switches of the first switching module and the two second unidirectional switches of the second switching module;

a bus bar assembly comprising:

a first bar electrically coupled to the heatsink and defining an output for the first AC voltage source and the second AC voltage source;

a second bar electrically coupled to the first switching module and electrically isolated from the first bar; and a third bar electrically coupled to the second switching module and electrically isolated from the first bar; and a controller that in response to the first voltage source not supplying a voltage:

opens the first switching module; and closes the second switching module.

2. The switching apparatus of claim 1, further comprising:

a second heatsink thermally coupled to the first switching module; and a third heatsink thermally coupled to the second switching module.

3. The switching apparatus of claim 2, wherein the bus bar assembly further comprises:

an output terminal connected to the first bar.

4. The switching apparatus of claim 3, wherein the bus bar assembly further comprise:

a first input terminal connected to the second bar, the first input terminal defining an input to the first switching module; and a second input terminal connected to the third bar, the second input terminal defining an input to the second switching module.

5. The switching apparatus of claim 1, wherein the heatsink is in direct mechanical contact with the first switching module and the second switching module.

6. The switching apparatus of claim 2, wherein:

the second heatsink is electrically coupled to the first switching module and the second bar is electrically coupled to the first switching module via the second heatsink;

the third heatsink is electrically coupled to the second switching module and the third bar is electrically coupled to the second switching module via the third heatsink.

* * * * *